United States Patent [19]

Nakamura et al.

[11] 4,340,835
[45] Jul. 20, 1982

[54] PIEZOELECTRICALLY DRIVEN TUNING FORK WITH INTEGRAL DAMPER MEMBER

[75] Inventors: Takeshi Nakamura, Uji; Yoshimasa Yamashita, Kameoka, both of Japan

[73] Assignee: Murata Manufacturing Co., Ltd., Japan

[21] Appl. No.: 178,892

[22] Filed: Aug. 18, 1980

Related U.S. Application Data

[63] Continuation of Ser. No. 5,197, Jan. 22, 1979, abandoned.

[30] Foreign Application Priority Data

Jan. 21, 1978 [JP] Japan ................................ 53/8685

[51] Int. Cl.³ .......................................... H01L 41/08
[52] U.S. Cl. .................................. 310/321; 310/326; 333/200
[58] Field of Search ............... 310/321, 326, 370, 345, 310/348, 25; 333/200; 84/409, 457

[56] References Cited

U.S. PATENT DOCUMENTS

| | | | |
|---|---|---|---|
| 3,354,413 | 11/1967 | Ko ........................................ | 333/200 |
| 3,480,809 | 11/1969 | Grib ...................................... | 310/25 |
| 3,581,130 | 5/1971 | Grib ...................................... | 310/25 |
| 3,816,778 | 6/1974 | Frey ...................................... | 310/25 |
| 3,984,790 | 10/1976 | Tanaka ............................. | 310/326 X |
| 3,986,150 | 10/1976 | Tanaka et al. .................. | 310/321 X |
| 4,025,879 | 5/1977 | Tanaka et al. .................. | 310/326 X |
| 4,037,121 | 7/1977 | Nakamura et al. ................. | 310/321 |
| 4,037,179 | 7/1977 | Terayama .......................... | 333/200 |
| 4,193,008 | 3/1980 | Nakamura .......................... | 310/321 |
| 4,220,885 | 9/1980 | Yamashita ....................... | 310/326 X |

*Primary Examiner*—Mark O. Budd

[57] ABSTRACT

The present invention is directed to a tuning fork wherein a damping piece is provided, either integral with said tuning fork vibrator or a separate piece attached thereto, and wherein a damper member is intersected between said damping piece and a housing for accommodating the tuning fork vibrator.

Since the ($\frac{1}{2}$)$f_O$ spurious response which is caused in the tuning fork vibrator to be spread within the damping piece is adapted to be absorbed by the damper member, the tuning fork is made smaller in shape.

10 Claims, 9 Drawing Figures

PIEZOELECTRICALLY DRIVEN TUNING FORK WITH INTEGRAL DAMPER MEMBER

RELATED APPLICATIONS

This is a continuation of U.S. Patent Application Ser. No. 5,197, filed Jan. 22, 1979, now abandoned.

BACKGROUND OF THE INVENTION

The present invention relates to a tuning fork with reduced half-natural-frequency spurious response.

It is well known that a tuning fork which consists of a pair of metal, vibratory arms extending from the end of a stem, when struck, emits a tone of fixed pitch. The tuning fork, when excited by the input signal, is caused to vibrate at its natural or fundamental frequency, and thus the frequency of the input signal is equal to the fundamental frequency. Therefore, such tuning forks are widely used to convert an electrical signal applied to the tuning fork into a signal having natural frequency of the tuning fork, and also, in the arrangement known as an electromechanical reed filter, for the purpose of passing the frequency component of an applied electrical signal corresponding to the natural frequency of the tuning fork.

In the electromechanical reed filter, the tuning fork is provided with a pair of electromechanical transducers such as piezoelectric elements, one for converting an exciting input signal in mechanical vibration of the tuning fork and the other for converting the vibration of the tuning fork into an electrical signal having the same frequency as the vibration of the fork.

In a conventional tuning fork, as shown in FIG. 1, piezoelectric elements 2a and 2b each made of barium titante ($BaTiO_3$) or the like are provided, respectively, on or near the vibratory node of the vibratory reeds or vibrating pieces 1a and 1b of a tuning fork vibrator 1, and the stem or base portion 1c of the tuning fork vibrator 1 is secured to a base 4 by a support rod 3, which functions as a common terminal. The piezoelectric elements 2a and 2b are electrically connected to terminals 5 and 6 of the base 4, and the tuning fork vibrator 1 is covered by a case 7 which is secured to the base 4 to form a housing. The tuning fork vibrator 1 is driven by a signal applied between the terminal 5 and the support rod 3, and the output signal is obtained from between the terminal 6 and the support rod 3.

However, in recent years, it has been desired to miniaturize such electronic parts as tuning forks and the like for use in increasingly compact electronic appliances. As the tuning fork is made smaller, the ratio of weight of the tuning fork vibrator 1 to the weight of the entire tuning fork increases due to maintain the similar configuration thereof, while the fraction of the weight made up by the remaining portion, including the base 4 and the case 7 decreases. Also, the percentage of the area of the vibrating piece occupied by the piezoelectric element becomes larger.

As shown in FIG. 2, when a conventional miniaturized tuning fork vibrator 1 is oscillating stably in the direction shown by arrows S in such a manner that during one half cycle of the vibration the vibrating pieces are approaching each other while during the other half cycle the vibrating pieces are moving apart since the weight of the part of the unit excluding the tuning fork vibrator itself is relatively small compared with that of the tuning fork vibrator, the part of the unit other than the vibrator is put into vibration at the frequency of the tuning fork vibrator but 180° out of phase with the vibration of the vibrating pieces 1a and 1b. arrows U and T showing the vibration directions of the tuning fork vibrator and of the remaining portion of the unit, respectively. In other words, during one half cycle of the vibration both vibrating pieces 1a and 1b of the tuning fork vibrator are moving in the direction of arrow $U_1$, while the remaining portion thereof brings to vibrate in the opposite direction (arrow $T_1$), and then during the other half cycle both vibrating pieces 1a and 1b of the tuning fork vibrator are moving in the other direction (arrow $U_2$) while the remaining portion moves in the first direction (arrow $T_2$), resulting in torsional vibration or twisting motion between the tuning fork vibrator and the remaining portion, and a so-called $(\frac{1}{2})f_0$ spurious response is generated at approximately one-half of the natural vibration frequency $f_0$. This limits the possible miniaturization of the tuning fork to a certain extent. In one approach to solving this problem the piezoelectric elements 2a and 2b may be replaced respectively by a pair of piezoelectric elements 2a' and 2a'', which are placed one above the other on the vibrating arm 1a, oriented parallel to the longitudinal direction of a vibrating piece 1a, are disposed on the vibrating piece and a pair of piezoelectric elements 2b' and 2b'', which are placed one above the other on the vibrating arm 1b, oriented parallel to the longitudinal direction of a vibrating piece 1b, as shown in FIG. 3. The piezoelectric elements 2a'' and 2b', and 2a' and 2b'' are electrically connected to terminal 5 and elements 2a' and 2'' to terminal 6. The respective ($\frac{1}{2}$) $F_0$ spurious responses generated by the two pairs of piezoelectric elements 2a'', 2b' and 2a', 2b'', respectively interfere destructively with each other, so that the net spurious response is small. However, the construction of the piezoelectric elements is complicated, and even with this construction, therefore, small tuning forks are hard to make.

It is the chief object of the present invention to provide a tuning fork of the above type without the disadvantages inherent in the conventional design and substantially without the ($\frac{1}{2}$)$f_0$ spurious response that is generated at approximately one-half the natural vibration frequency $f_0$ in conventional tuning fork vibrators, without interfering with the natural vibration of the tuning fork vibrator.

Another object of the present invention is to provide a tuning fork equipped with a damper between the fork itself and the housing, to prevent noise that would otherwise be caused by an external mechanical shock such as dropping the tuning fork.

A further object of the present invention is to provide a tuning fork which is strong in construction, but without causing any deformation of the tuning fork vibrator or the mounting arrangement thereof.

A still further object of the present invention is to provide a compact, high-quality tuning fork that is that is easy to assemble.

SUMMARY OF THE INVENTION

According to the present invention, there is provided a tuning fork comprising a tuning fork vibrator of approximately U shape the arms of which are a pair of vibrating pieces, with a damping piece provided at its base portion, a rod for supporting the damping piece, at least one of piezoelectric element mounted on the vibrating piece, a base for supporting the rod provided with an electrical terminal connected to the piezoelectric element, a casing secured to the base to form a housing accommodating the tuning fork vibrator, and a damper means provided between the damping piece and the housing. The mass of the tuning fork vibrator is a large enough fraction of the total mass of the tuning fork, including the vibrator, $(\frac{1}{2})f_0$ spurious response without impeding the normal vibration of the tuning fork vibrator, so that the tuning fork can be minimized in size.

These objects and other objects, features, aspects, and advantages of the present invention will become more apparent from the following detailed description of the present invention when taken in conjunction with the accompanying drawings.

DETAILED DESCRIPTION OF THE INVENTION

Figure 1:
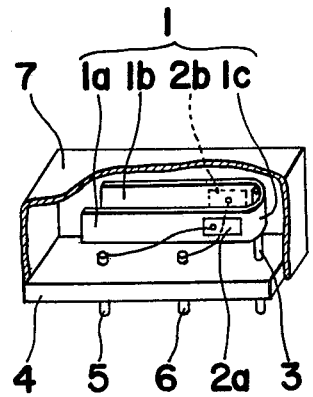
FIG. 1 is a perspective view, partially cut away, showing a tuning fork of conventional type.
Figure 2:
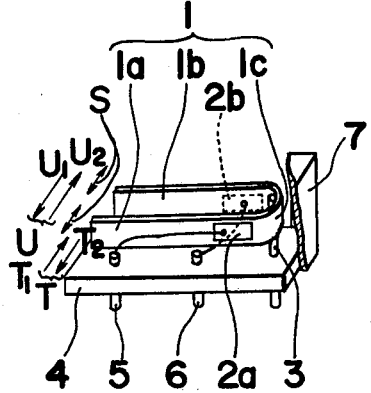
FIG. 2 is a similar view illustrating the spurious response produced by a conventional tuning fork vibrator.
Figure 3:
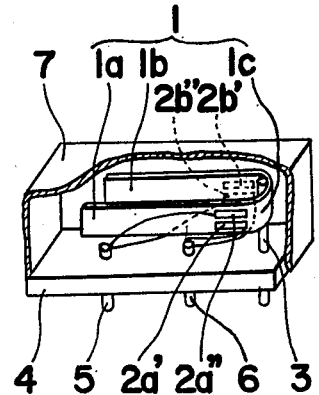
FIG. 3 is a perspective view, partially cut away, showing another tuning fork of conventional type.

Referring to FIGS. 4 to 7, there is shown a tuning fork comprising a tuning fork vibrator 11 of U shape including a pair of vibrating pieces or vibratory reeds 11a and 11b and a damping piece 13, all of which extend from the end of the base portion or stem 11c of the tuning fork vibrator 11, a rod 17 connected to the damping piece 13 at one end for supporting the tuning fork vibrator 11, which rod functions as a common terminal for the tuning fork vibrator 11, a pair of piezoelectric elements 12a and 12b provided on the vibrating node portion of the vibrating pieces 11a, 11b of the tuning fork vibrator 11, a base 16 for supporting the rod 17 and provided with a pair of terminals 14 and 15 which are connected to piezoelectric elements 12a and 12b respectively, a casing 18 secured to the base 16 to form a housing for accommodating the tuning fork vibrator 11, and a damper member 19 provided between the tuning fork vibrator 11 and the housing to damp the vibration of the tuning fork vibrator 11.

The tuning fork vibrator 11 is formed, by punching one sheet of metal plate, of one unit having a configuration of U shape consisting of a pair of vibrating pieces 11a, 11b and the damping piece 13 disposed at the base portion 11c of the tuning fork vibrator 11. The damping piece 13 may have, for example, a rectangular shape. It extends to both sides from the base portion 11c of the tuning fork vibrator 11 to form a cross piece disposed at the base portion 11c and perpendicular to the vibrating pieces 11a, 11b of the tuning fork vibrator 11. The vibrating pieces 11a and 11b are the arms of the tuning fork vibrator 11 extending from the base portion 11c of the tuning fork vibrator 11 parallel to each other. Each vibrating piece is substantially planar, and as noted above, both are perpendicular to the plane of the damping piece 13. The piezoelectric elements 12a, 12b are made of acid barium or the like, and are attached to the vicinity of the vibrating node portions of the vibrating pieces 11a, 11b, respectively so as to form a tuning fork oscillator or a filtering element.

Figure 4:
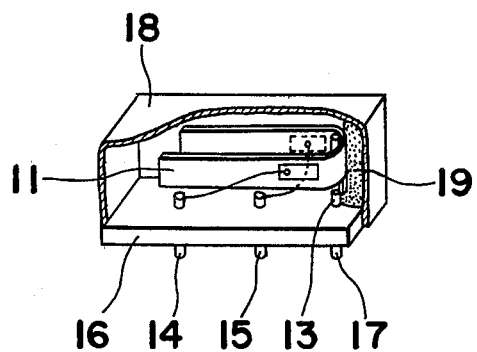
FIG. 4 is a perspective view, partially cut away, of a tuning fork according to one embodiment of the present invention.
Figure 5:
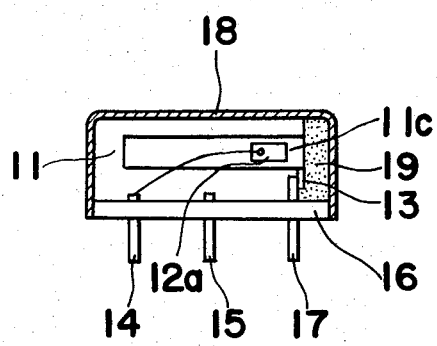
FIG. 5 is a vertical cross-sectional view of the tuning fork shown in FIG. 4 as seen from section line 5—5 in FIG. 4.

The tuning fork vibrator 11 having the damping piece 13 at its base portion 11c is mounted by means of the support rod 17 on the base 16 approximately parallel to and a certain distance above the base, by means of spot welding or the like. The support rod 17 and terminals 14, 15 are mounted on the base 16, through which they extend vertically, by means of an insert mold, etc., as shown in FIG. 4. Rod 17 is preferably connected to the center portion of the damping piece 13 rather than to the base portion of the vibrating pieces 11a, 11b. Since the accelerations induced in the damping piece 13 by the vibrations of tuning fork vibrator 11 are not as large as those experienced by the base portion 11c of the tuning fork vibrator 11 itself, the support rod 17 connected with the damping piece 13, without affecting the tuning fork characteristics, minimizes residual distortion due to heating or to the action of external forces on the connection between the support rod 17 and a given application does not require the damping piece 13. However, if a tuning fork of such high quality, the supporting rod 17 may be connected to the base portion 11c of the tuning fork vibrator 11. The piezoelectric elements 12a and 12b pasted on the vibrating pieces 11a and 11b of the tuning fork vibrator 11 are electrically connected to the terminal 14 and the terminal 15, respectively, while the support rod 17 functions as a common terminal for the tuning fork vibrator 11.

The damper member 19 is made of an elastic material such as sponge, rubber or the like and occupies the space among the base portion 11c, the damping piece 13 and the case 18. The damper member may be attached under pressure to the base portion 16, the damping piece 13 and the case 18. It is adapted to damp the vibration of the $(\frac{1}{2})f_0$ spurious mode in the tuning fork vibrator 11.

Figure 6:
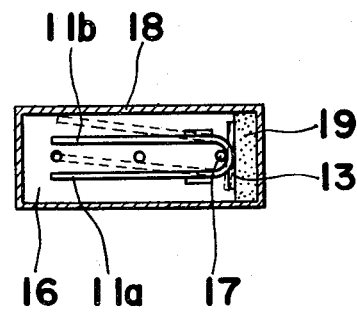
FIG. 6 is a horizontal cross-sectional view of FIG. 4 as seen from section line 6—6 in FIG. 5.
Figure 7:
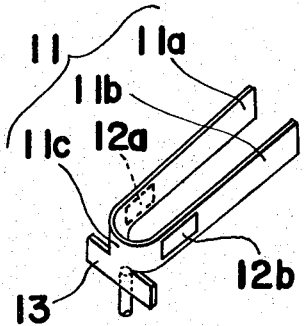
FIG. 7 is a perspective view of the tuning fork vibrator employed in the tuning fork of FIG. 4.

According to the embodiment of the present invention described above, upon production of the vibrations on the vibrating pieces of the tuning fork vibrator due to the $(\frac{1}{2})f_0$ spurious response, the vibrations of the tuning fork vibrator 11, indicated in FIG. 6 by the dotted line, are transmitted from the damping piece 13 to the damper member 19, and are damped by the damper member 19, with the result that the $(\frac{1}{2})f_0$ spurious response is almost completely eliminated.

The phenomenon of insertion loss is well known. When the tuning fork is part of an electrical circuit assembly, a certain fraction of the energy of the input signal supplied to the tuning fork is consumed. Although it might be expected that use of the damper member 19 would increase the insertion loss in the range of frequencies in which such tuning forks are used, experiments on the tuning fork of the present invention show that the insertion loss due to the damper member 19 can be disregarded in practice and that improvement of the gain of approximately 10 to 20 dB can be obtained from the tuning fork vibrator of the present invention in the vicinity of $(\frac{1}{2})f_0$ with no ill effect on the natural vibration of the tuning fork vibrator.

Figure 8:
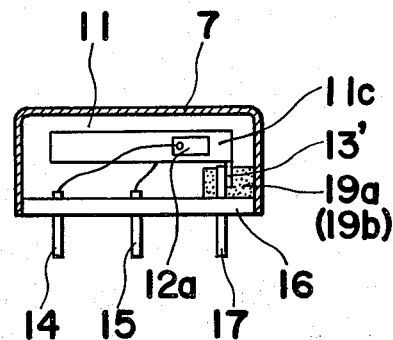
FIG. 8 is a vertical cross-sectional view similar to FIG. 5 showing a tuning fork according to another embodiment of the present invention.
Figure 9:
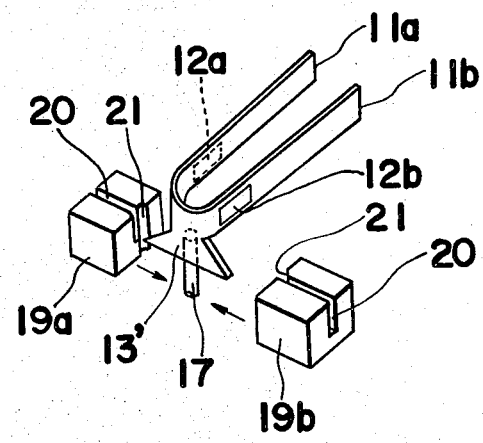
FIG. 9 is a perspective view of a tuning fork vibrator and a damper member employed in the tuning fork of FIG. 7.

FIGS. 8 and 9 show another embodiment of the present invention. In this embodiment, a damping piece 13' disposed on the base portion 11c of the tuning fork vibrator 11 is formed in a triangular shape which is wider in its lower end portion as shown in FIG. 9, instead of the rectangular shape shown in FIG. 5. Two damper members 19a and 19b of such a material as molded rubber are provided in place of the damper member 19, each having a groove 20 which engages the damping piece 13' and a semicircular groove 21 (in section) which engages the support rod 17. As shown in FIG. 8, these damper members 19a and 19b are adapted to be bonded to the base 16 or the case 7, or to be held against the base 16 or the case 7 by friction.

The tuning fork vibrator 11 of the embodiment is damped by the damper members 19a and 19b, and the $(\frac{1}{2})f_0$ spurious response can be almost completely eliminated from the vibration of the vibrator 11 in the same manner as in the embodiment shown in FIGS. 4 to 7.

The present invention is not restricted to the above-described embodiments. For example, the damping pieces 13 and 13' of the tuning fork vibrator 11 may be mounted, by welding, etc., on the exterior side of the base portion 11c, instead of being formed integrally with the tuning fork vibrator 11. Again, the damping pieces 13 and 13' need not have the rectangular or the triangular shapes shown in the above-described embodiments, but may have any convenient shape. In addition, the damping pieces can equally well be located to one side only of the base portion, instead of on both sides. The vibrating pieces need not be normal to the damping pieces. Also, it is to be noted that the tuning fork vibrator can be operated with only one piezoelectric element mounted on the vibrating piece 1a or 1b in association with the support rod connected to the base portion of the tuning fork vibrator.

The damper member shown in the above embodiments of the present invention prevents almost totally the housing vibration that causes $(\frac{1}{2})f_0$ spurious response. Thus, a tuning fork of the present invention can be made very small or compact and yet of a very high quality. Accordingly, even if external shocks, etc. are applied to the tuning fork, the tuning fork is prevented from picking up the shock noises, and the mounting arrangement of the tuning fork is also prevented from being deformed by external shock applied or by the tuning fork's being dropped.

Although the present invention has been described and illustrated in detail in connection with several preferred embodiments thereof, it is to be clearly understood that the same is by way of illustration and example only and is not to be taken by way of limitation, the spirit and scope of the present invention being limited only by the terms of the appended claims.

What is claimed is:

1. A tuning fork, comprising:

a tuning fork vibrator of approximately U-shape, having a base portion and two arms, the arms of said U-shaped vibrator being vibrating pieces;

a damping piece in mechanical contact with said base portion of said U-shaped vibrator;

support means for supporting said damping piece, said support means and said damping piece cooperating to support said tuning fork vibrator; said support means being in electrical contact with said base portion of said vibrator so as to form an electrical terminal for said tuning fork vibrator, said support means being physically separated from said base portion by said damping piece;

at least one piezoelectric element located on one of said vibrating pieces of said tuning fork vibrator;

a housing containing said tuning fork vibrator, supporting said support means and provided with an electrical terminal connected to said piezoelectric element;

the mass of said tuning fork vibrator being a large enough fraction of the combined mass of said vibrator, said support means, said damping piece, said at least one piezoelectric element and said housing to cause a significant spurious response in the vicinity of approximately one-half the natural frequency of said tuning fork vibrator; and a damper means provided between and in mechanical contact with said damping piece and said housing, for damping vibrations of said tuning fork vibrator in the vicinity of approximately one-half of said natural vibration frequency of said tuning fork vibrator.

2. A tuning fork as claimed in claim 1, wherein said tuning fork vibrator is one integral unit formed through the punch of one sheet of metal plate.

3. A tuning fork as claimed in claim 1, wherein said damping piece is welded to said base portion.

4. A tuning fork as claimed in claim 2, wherein said damping piece is rectangular.

5. A tuning fork as claimed in claim 2, wherein said damping piece is triangular.

6. A tuning fork as claimed in claim 1, wherein said support means is connected mechanically to said damping piece.

7. A tuning fork as claimed in claim 1, wherein said damping piece extends downward from said base portion of said tuning fork vibrator so as to form a generally planar cross piece disposed at said base portion and disposed perpendicular to the direction of extension of said vibrating pieces.

8. A tuning fork as claimed in claim 1, wherein said damper means is made of an elastic material and is interposed between said tuning fork vibrator and said housing.

9. A tuning fork as claimed in claim 8, wherein said damper means is formed of a rubber material and engages a said damping piece.

10. A tuning fork as claimed in claim 8, wherein said damper means is formed of a rubber material and engages said damping piece and said support means.

* * * * *